United States Patent
Tano et al.

(10) Patent No.: US 8,502,203 B2
(45) Date of Patent: Aug. 6, 2013

(54) LAMINATED STRUCTURE, METHOD OF MANUFACTURING A LAMINATED STRUCTURE, ELECTRONIC ELEMENT, ELECTRONIC ELEMENT ARRAY, IMAGE DISPLAYING MEDIUM, AND IMAGE DISPLAYING DEVICE

(75) Inventors: Takanori Tano, Chiba (JP); Koei Suzuki, Kanagawa (JP); Yusuke Tsuda, Fukuoka (JP)

(73) Assignee: Ricoh Company, Ltd., Tokyo (JP)

( * ) Notice: Subject to any disclaimer, the term of this patent is extended or adjusted under 35 U.S.C. 154(b) by 333 days.

(21) Appl. No.: 12/864,800

(22) PCT Filed: Feb. 3, 2009

(86) PCT No.: PCT/JP2009/052126
§ 371 (c)(1),
(2), (4) Date: Jul. 27, 2010

(87) PCT Pub. No.: WO2009/099227
PCT Pub. Date: Aug. 13, 2009

(65) Prior Publication Data
US 2010/0308321 A1 Dec. 9, 2010

(30) Foreign Application Priority Data
Feb. 7, 2008 (JP) .................... 2008-027912

(51) Int. Cl.
*H01L 29/08* (2006.01)
(52) U.S. Cl.
USPC ............ 257/40; 257/E51.002; 257/E51.022

(58) Field of Classification Search
USPC ............................... 257/40; 438/660
See application file for complete search history.

(56) References Cited

U.S. PATENT DOCUMENTS

| | | | |
|---|---|---|---|
| 2001/0022497 A1 | 9/2001 | Aoki et al. | |
| 2004/0238816 A1* | 12/2004 | Tano et al. | 257/40 |
| 2005/0095356 A1 | 5/2005 | Nakamura et al. | |
| 2006/0124925 A1* | 6/2006 | Kondo et al. | 257/40 |
| 2006/0157692 A1 | 7/2006 | Wada et al. | |
| 2007/0096088 A1* | 5/2007 | Tano et al. | 257/40 |
| 2007/0207274 A1 | 9/2007 | Fujii | |
| 2007/0213502 A1* | 9/2007 | Kondo et al. | 528/310 |

(Continued)

FOREIGN PATENT DOCUMENTS

| | | |
|---|---|---|
| CN | 101627464 A | 1/2010 |
| EP | 1128438 A1 | 8/2001 |

(Continued)

OTHER PUBLICATIONS

Oct. 12, 2011 European search report in connection with counterpart European patent application No. 09 70 7643.

(Continued)

*Primary Examiner* — A. Sefer
(74) *Attorney, Agent, or Firm* — Cooper & Dunham LLP

(57) ABSTRACT

Disclosed is a laminated structure, including a substrate, a wettability changing layer on the substrate, the wettability changing layer including a material, a critical surface tension of the material being changed by providing energy thereto, and an electrically conductor layer on the substrate, the electrically conductor layer formed on a region of the wettability changing layer, the region being provided with the energy, wherein the material includes a structural unit including a side chain and a structural unit including no side chain.

8 Claims, 6 Drawing Sheets

(56) References Cited

U.S. PATENT DOCUMENTS

| | | |
|---|---|---|
| 2008/0176347 A1 | 7/2008 | Nakamura et al. |
| 2009/0258450 A1 | 10/2009 | Nakamura et al. |
| 2010/0078642 A1 | 4/2010 | Tano et al. |
| 2011/0143469 A1 | 6/2011 | Nakamura et al. |

FOREIGN PATENT DOCUMENTS

| | | |
|---|---|---|
| JP | 2-225522 | 9/1990 |
| JP | 2003-76004 | 3/2003 |
| JP | 2006-21491 | 1/2006 |
| JP | 2006-60113 | 3/2006 |
| JP | 2006-134959 | 5/2006 |
| JP | 2007-248637 | 9/2007 |
| JP | 2007-324201 | 12/2007 |
| WO | WO2006/049288 | 5/2006 |
| WO | WO2008/126574 A1 | 10/2008 |

OTHER PUBLICATIONS

International Search Report in PCT/JP2009/052126.

NTS. Inc., "Current Polyimides—Basic and Application—", pp. 388-407, pp. 140-175.

Technical Information Institute Co., Ltd., "New Development and High-function-Imparting Techniques of Polyimides Intended for Electronics and Electronic Materials for the Next Generation" pp. 256-262.

NTS Inc., "Dendritic Polymers," pp. 3-6.

Nov. 17, 2011 Chinese official action (with English translation) in connection with a counterpart Chinese patent application.

* cited by examiner

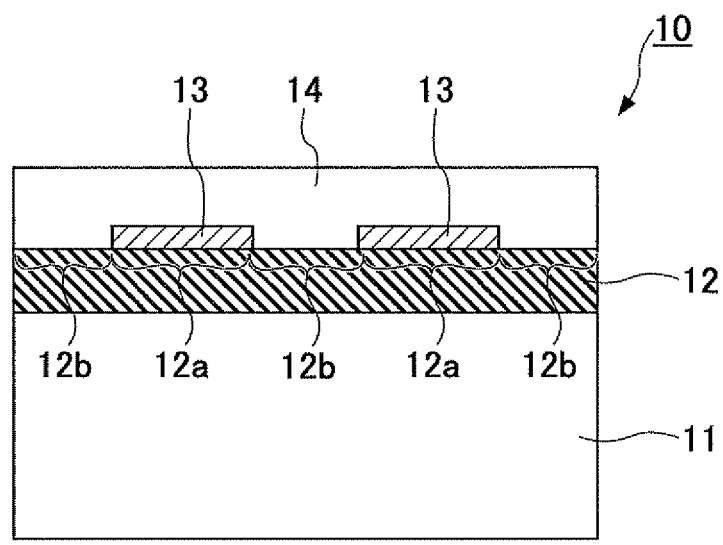

LAMINATED STRUCTURE, METHOD OF MANUFACTURING A LAMINATED STRUCTURE, ELECTRONIC ELEMENT, ELECTRONIC ELEMENT ARRAY, IMAGE DISPLAYING MEDIUM, AND IMAGE DISPLAYING DEVICE

TECHNICAL FIELD

The present invention relates to a laminated structure, a method of manufacturing a laminated structure, an electronic element, an electronic element array, an image displaying medium, and an image displaying device.

BACKGROUND ART

An organic thin-film transistor may be formed by using a printing method when a material soluble in a solvent is used for a semiconductor material, an insulating material, and an electrode material, and for example, a large area organic thin-film transistor may be formed on a film substrate having flexibility inexpensively. Also, a thin film or circuit may be formed readily by using a printing method, a spin-coat method, a dipping method, or the like.

As one parameter for indicating a characteristic of such an organic thin-film transistor, there may be provided an on-off ratio of electric current ($I_{on}/I_{off}$). In an organic thin-film transistor, an electric current $I_{ds}$ flowing between source and drain electrodes in a saturation region is represented by the formula:

$$I_{ds} = \mu C_{in} W (V_G - V_{TH})^2 / 2L,$$

wherein $\mu$ is a field-effect mobility, $C_{in}$ is a capacitance per unit area of a gate insulating film, W is a channel width, L is a channel length, $V_G$ is a gate voltage, and $V_{TH}$ is a threshold voltage. Additionally, $C_{in}$ is represented by the formula:

$$C_{in} = \in \in_0 / d,$$

wherein $\in$ is a relative dielectric constant of the gate insulating film, $\in_0$ is the dielectric constant of vacuum, and d is a thickness of the gate insulating film.

Therefore, it is found that it is effective to increase the field-effect mobility, decrease the channel length, or increase the channel width, etc., in order to increase an on-state current. Herein, the field-effect mobility principally depends on material characteristics. Meanwhile, it has been known that the distance between source and drain electrodes is decreased in order to decrease the channel length.

The channel length is usually 10 μm or less because the field-effect mobility of an organic semiconductor material is smaller than that of a silicon semiconductor. As one method for decreasing the distance between source and drain electrodes accurately, there is provided photolithography used for forming a Si-based thin film transistor.

Photolithography is usually composed of processes of:

1. applying a photoresist layer on a substrate having a thin-film layer (resist application);
2. removing a solvent by means of heating (pre-bake);
3. conducting irradiation with ultraviolet light through a hard mask that has been patterned by using laser or electron beams in accordance with pattern data (light exposure);
4. removing the resist at a light-exposed portion with an alkaline solution (development);
5. curing the resist at a light-unexposed portion (patterned portion) by means of heating (post-bake);
6. conducting dipping in an etching liquid or exposure to an etching gas so as to remove the thin-film layer at a resist-free portion (etching); and
7. removing the resist by means of an alkaline solution or an oxygen radical (resist release). After each thin-film layer is thus formed, a thin-film transistor is formed by repeating the processes 1-7 but its expensive equipment and long-time process may cause its cost increase.

Therefore, an electrode pattern has been formed by using a printing method such as an ink-jet method or the like in order to reduce the production costs. As the ink-jet method is used, it may be possible to make an electrode pattern directly, and accordingly, the efficiency of material use may be increased, whereby it may be possible to realize simplification and cost reduction of a production process. In the ink-jet method, however, it may be difficult to reduce the degree of ejection, and it may be difficult to form a fine pattern, as a landing precision depending on a mechanical error or the like is taken into consideration.

Herein, Japanese Patent Application Publication No. 2006-060113 discloses a laminated structure including a wettability changing layer containing a material whose critical surface tension is changed by irradiation with ultraviolet rays, an electrically conductive layer, and a semiconductor layer. Then, the wettability changing layer has at least two portions with different critical surface tensions such as a higher surface energy portion with a greater critical surface tension and a lower surface energy portion with a smaller critical surface tension. Also, the electrically conductive layer is formed on the higher surface energy portion of the wettability changing layer by providing a liquid containing an electrically conductive material using an ink jet method while the semiconductor layer is provided, at least, so as to contact the lower surface energy portion of the wettability changing layer. Furthermore, the wettability changing layer contains a polymer material containing a methylene group and having a hydrophobic group at a side chain thereof. Thereby, it may be possible to readily form a fine patter.

Meanwhile, Japanese Patent Application No. 2006-134959 discloses a method for manufacturing an organic transistor composed of a substrate, a gate electrode, a two- or more-layer-laminated gate insulating layer, source and drain electrodes, and an organic semiconductor layer. Then, a channel is formed by applying mask light exposure with ultraviolet rays (UV light) in a wavelength range of 200 nm or greater and 300 nm or less on the two- or more-layer-laminated gate insulating layer, ejecting an electrode material for making the source and drain electrodes onto a mask-light-exposed portion by means of an ink jet method, and dividing the electrode material into a mask-light-exposed part and a light-unexposed part due to the difference between their surface free energies.

However, there may be a problem that the tact time is so long that simplification or cost reduction of a production process is hardly attained, because the irradiance of the ultraviolet rays is large for sufficiently changing the critical surface tension or surface free energy.

DISCLOSURE OF THE INVENTION

According to one aspect of the present invention, there is provided a laminated structure, including a substrate, a wettability changing layer on the substrate, the wettability changing layer including a material, a critical surface tension of the material being changed by providing energy thereto, and an electrically conductor layer on the substrate, the electrically conductor layer formed on a region of the wettability changing layer, the region being provided with the energy, wherein the material includes a structural unit including a side chain and a structural unit including no side chain.

According to another aspect of the present invention, there is provided a method of manufacturing a laminated structure, including a first step of forming a wettability changing layer on a substrate, the wettability changing layer including a material, a critical surface tension of the material being changed by providing energy thereto, a second step of providing energy to a predetermined region of the wettability changing layer to change the critical surface tension, and a third step of applying a liquid including an electrically conductive material to form an electrically conductor layer on the region of the wettability changing layer, the region being provided with the energy, wherein the material includes a structural unit including a side chain and a structural unit including no side chain.

According to another aspect of the present invention, there is provided an electronic element, including the laminated structure as described above.

According to another aspect of the present invention, there is provided an electronic element array, including a plurality of the electronic elements as described above.

According to another aspect of the present invention, there is provided an image displaying medium, including the electronic element array as described above.

According to another aspect of the present invention, there is provided an image displaying device, including the image displaying medium as described above.

BRIEF DESCRIPTION OF THE DRAWINGS

FIG. 1 is a cross-sectional diagram illustrating one example of a laminated structure according to a specific example of the present invention.

FIG. 2 is a schematic diagram illustrating one example of a polyimide that is used in a specific example of the present invention.

BEST MODE FOR CARRYING OUT THE INVENTION

Figure 3:
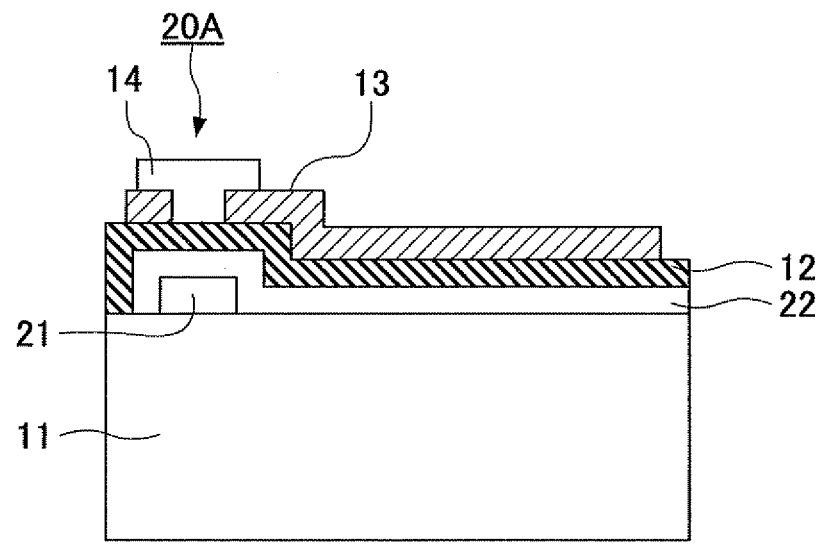
FIG. 3 is a cross-sectional diagram illustrating a first example of an electronic element according to a specific example of the present invention.

Next, some illustrative embodiments of the present invention will be described below.

It may be one object of an illustrative embodiment of the present invention to provide a laminated structure capable of readily forming a fine pattern of electrically conductor layer with less ultraviolet ray irradiance or a method of manufacturing the laminated structure.

Furthermore, it may be another object of an illustrative embodiment of the present invention to provide an electronic element including the laminated structure, an electronic element array including a plurality of the electronic element, an image displaying medium including the electronic element array, or an image displaying device including the image displaying medium.

According to a first illustrative embodiment of the present invention, there may be provided a laminated structure, including on a substrate a wettability changing layer containing a material whose critical surface tension is changed by providing energy thereto and an electrically conductor layer formed on a region of the wettability changing layer which region is provided with the energy, wherein the material whose critical surface tension is changed by providing energy thereto is composed of a structural unit including a side chain and a structural unit including no side chain.

According to a second illustrative embodiment of the present invention, there may be provided the laminated structure according to the first illustrative embodiment of the invention, wherein the side chain includes a hydrophobic group.

According to a third illustrative embodiment of the present invention, there may be provided the laminated structure according to the first or second illustrative embodiment of the present invention, wherein the side chain includes a multiply-branched structure.

According to a fourth illustrative embodiment of the present invention, there may be provided the laminated structure according to the third illustrative embodiment of the present invention, wherein the material whose critical surface tension is changed by providing energy thereto contains 5 mole % or more and 80 mole % or less of the structural unit including a side chain.

According to a fifth illustrative embodiment of the present invention, there may be provided the laminated structure according to any one of the first to fourth illustrative embodiments of the present invention, wherein a main chain of the material whose critical surface tension is changed by providing energy thereto is a polyimide.

According to a sixth illustrative embodiment of the present invention, there may be provided the laminated structure according to the fifth illustrative embodiment of the present invention, wherein the polyimide is a soluble polyimide.

According to a seventh illustrative embodiment of the present invention, there may be provided the laminated structure according to any one of the first to sixth illustrative embodiments of the present invention, wherein it further includes a semiconductor layer.

According to an eighth illustrative embodiment of the present invention, there may be provided the laminated structure according to the seventh illustrative embodiment of the present invention, wherein the semiconductor layer is composed of an organic semiconductor material.

According to a ninth illustrative embodiment of the present invention, there may be provided a method of manufacturing a laminated structure, including a first process of forming on a substrate a wettability changing layer containing a material whose critical surface tension is changed by providing energy thereto, a second process of providing energy to a predetermined region of the wettability changing layer to change the critical surface tension, and a third process of applying a liquid containing an electrically conductive material to form an electrically conductor layer on the region of the wettability changing layer which region is provided with the energy, wherein the material whose critical surface tension is changed by providing energy thereto is composed of a structural unit including a side chain and a structural unit including no side chain.

According to a tenth illustrative embodiment of the present invention, there may be provided the method of manufacturing a laminated structure according to the ninth illustrative embodiment of the present invention, wherein the energy is provided to the predetermined region of the wettability changing layer by irradiating it with an ultraviolet ray.

According to an eleventh illustrative embodiment of the present invention, there may be provided the method of manufacturing a laminated structure according to the ninth or tenth illustrative embodiment of the present invention, wherein the liquid containing an electrically conductive material is applied by using an ink jet method.

According to a twelfth illustrative embodiment of the present invention, there may be provided the method of manufacturing a laminated structure according to any one of the ninth to eleventh illustrative embodiments of the present invention, wherein it includes a plurality of the first processes, second processes and third processes.

According to a thirteenth illustrative embodiment of the present invention, there may be provided an electronic element wherein it includes the laminated structure according to any one of the first to eighth illustrative embodiments of the present invention.

According to a fourteenth illustrative embodiment of the present invention, there may be provided an electronic element array wherein it includes a plurality of the electronic elements according to the thirteenth illustrative embodiment of the present invention.

According to a fifteenth illustrative embodiment of the present invention, there may be provided an image displaying medium wherein it includes the electronic element array according to the fourteenth embodiment of the present invention.

According to a sixteenth illustrative embodiment of the present invention, there may be provided an image displaying device wherein it includes the image displaying medium according to the fifteenth illustrative embodiment of the present invention.

According to an illustrative embodiment of the present invention, it may be possible to provide a laminated structure capable of readily forming a fine pattern of electrically conductor layer with less ultraviolet ray irradiance or a method of manufacturing the laminated structure.

Furthermore, according to an illustrative embodiment of the present invention, it may be possible to provide an electronic element including the laminated structure, an electronic element array including a plurality of the electronic element, an image displaying medium including the electronic element array, or an image displaying device including the image displaying medium.

Next, some specific examples of the present invention will be described with reference to the accompanying drawings below.

FIG. 1 illustrates one specific example of a laminated structure according to an embodiment of the present invention. In a laminated structure 10, a wettability changing layer 12 is formed on a substrate 11. Herein, the wettability changing layer 12 contains a material whose critical surface tension (surface free energy) is changed by providing energy thereto. Furthermore, high surface energy parts 12a with a large critical surface tension which have been provided with energy and low surface energy parts 12b with a small critical surface tension which have not been provided with energy are formed in the wettability changing layer 12. Additionally, the low surface energy part 12b with a thickness of, for example, about 1-5 μm is formed between the tow high surface energy parts 12a. Moreover, electrical conductor layers 13 are formed on the high surface energy parts 12a and a semiconductor layer 14 is formed on the wettability changing layer 12 on which the electrical conductor layers 13 are formed. Thereby, it may be possible to form a fine pattern of the electrical conductor layers 13 conveniently.

Next, a method for manufacturing a laminated structure 10 is described below.

First, a wettability changing layer 12 containing a material whose critical surface tension is changed by providing energy thereto is formed on a substrate 11. Then, the critical surface tension of the wettability changing layer 12 is changed by providing energy to a predetermined area of the wettability changing layer 12 formed on the substrate 11. Thereby, high surface energy parts 12a and low surface energy parts 12b are formed in the wettability changing layer 12. Herein, a method for providing energy is not particularly limited and there are provided heating, ultraviolet ray irradiation, electron beam irradiation, plasma irradiation, and the like, wherein ultraviolet ray irradiation is preferable because it may be possible to form a highly fine and highly dense pattern. Furthermore, a liquid containing an electrically conductive material is applied thereto so that electrical conductor layers 13 are formed on the high surface energy parts 12a in which the critical surface tension of the wettability changing layer 12 has been changed. Finally, a semiconductor layer 14 is formed on the wettability changing layer 12 on which the electrical conductor layers 13 have been formed.

For the material whose critical surface tension is changed by providing energy thereto, a material whose critical surface tension change between before and after providing energy thereto is large is preferable and a material whose critical surface tension is changed from its low (or hydrophobic) state to its high (or hydrophilic) state is particularly preferable. Thereby, a liquid containing an electrically conductive material readily attaches to the high surface energy parts 12a and hardly attaches to the low surface energy parts 12b and therefore selectively attaches to the high surface energy parts 12a. As a result, the electrical conductor layers 13 are selectively formed on the high surface energy parts 12a by solidifying the liquid containing an electrically conductive material.

The material whose critical surface tension is changed by providing energy thereto is composed of a structural unit having a side chain and a structural unit having no side chain whereby it may be possible to improve the filming performance of the wettability changing layer 12. Herein, the side chain bonds to the main chain and preferably has a hydrophobic group. Thereby, it may be possible to change the critical surface tension of the wettability changing layer 12 greatly with a low ultraviolet ray irradiance. The hydrophobic group is not particularly limited and there are provided functional groups whose end group is $-CF_2CH_3$, $-CF_2CF_3$, $-CF(CF_3)_2$, $-CFH_2$, or the like, wherein an alkyl group or a fluoroalkyl group is preferable. Furthermore, the main chain of the material whose critical surface tension is changed by providing energy thereto is not particularly limited and there are provided skeletons obtained by polymerizing a polyimide, a polyamideimide, or a (meth)acrylic acid and the like, wherein a polyimide is preferable as the insulating performance of the wettability changing layer 12 to which energy has been provided is taken into consideration. Because a polyimide generally has a rigid structure and a good packing property, it may be possible to maintain a certain degree of its insulating performance even though energy is provided by means of ultraviolet ray irradiation or the like so that its molecular chain may be broken.

Polyimides include insoluble polyimides insoluble (or hardly soluble) in a solvent which may be obtained by heating a polyamic acid (a polyamide acid) to dehydrate or condensate it and soluble polyimides soluble in a solvent, wherein a soluble polyimide is particularly preferable because it may be possible to apply a polyimide solution using a printing method. Specifically, after a polyimide solution is applied, a solvent is volatilized at a low temperature less than 200° C. whereby it may be possible to form a film. On the other hand, it may be necessary to heat an insoluble polyimide until its dehydration or condensation is sufficiently caused, and it may often be necessary to provide a high temperature of 200° C. or higher.

A soluble polyimide may be obtained by applying chemical imidization treatment to a polyamic acid in a solution which polyamic acid may be obtained by reacting a diamine with a tetracarboxylic dianhydride. Generally, when a polyimde has a rigid structure, it may be difficult to dissolve in a solvent. Herein, it is preferable to use a bulky alicyclic tetracarboxylic dianhydride for the tetracarboxylic dianhydride in order to reduce the crystallinity of a polyimide and promote its solvation. Additionally, no or little unreacted polyamic acid or tetracarboxylic dianhydride as a by-product remains in the soluble polyimide, and therefore, a problem hardly occurs that the electrical properties of a polyimde is degraded by these impurities.

For example, a soluble polyimide is soluble in a solvent with a high polarity such as γ-butyrolactone, N-methylpyrrolidone, and N,N-dimethylacetamide. Therefore, if a solvent with a low polarity such as toluene, xylene, and isopropyl alcohol is used when the semiconductor layer 14 is formed on the wettability changing layer 12, it may be possible to reduce corrosion of the wettability changing layer 12 which is caused by a solvent.

For identifying a tetracarboxylic dianhydride used in synthesizing a polyimide, it may be possible to use analysis of infrared absorption spectrum and/or ultraviolet and visible absorption spectrum of a thin film of the polyimide. The wavelength of the absorption edge of a thin film of a polyimide synthesized by using a bulky alicyclic tetracarboxylic dianhydride is 300 nm or less. Additionally, its details are described in "CURRENT POLYIMIDES—BASIC AND APPLICATION—" (published by NTS Inc.), "NEW DEVELOPMENT AND HIGH-FUNCTION-IMPARTING TECHNIQUES OF POLYIMIDES INTENDED FOR ELECTRONICS AND ELECTRONIC MATERIALS FOR THE NEXT GENERATION" (published by Technical Information Institute Co., Ltd.) and the like.

One example of such a polyimide is illustrated in FIG. 2. The polyimide is composed of a structural unit(s) $X^1$—$Y^1$ having a side chain and a structural unit(s) $X^2$—$Y^2$ having no side chain, wherein each of $X^1$ and $X^2$ originates from a tetracarboxylic dianhydride having no side chain, $Y^1$ originates from a diamine having a side chain, and $Y^2$ originates from a diamine having no side chain. In addition, $X^1$ and $X^2$ may be identical to or different from each other. Furthermore, $X^1$, instead of $Y^1$, may have a side chain. Moreover, x and y are their copolymerization rates (mole %), wherein it is preferable to satisfy the formula:

$5 \leq x \leq 80$ ($x+y=100$), and it is particularly preferable to satisfy the formula:

$20 \leq x \leq 60$ ($x+y=100$).

Thereby, it may be possible to achieve a balance between a change of the critical surface tension of the wettability changing layer 12 between before and after providing energy thereto and the filming performance thereof.

Additionally, each of $X^1$, $X^2$, $Y^1$, and $Y^2$ may be composed of two or more kinds of structural units and two or more kinds of diamines with different side chain structures may be used. Furthermore, a diamine having a siloxane skeleton in a side chain thereof may be used in order to improve its insulating performance. Moreover, a structural unit originating from a compound except tetracarboxylic dianhydrides and diamines may be introduced into the polyimide.

The polyimide composed of a structural unit(s) having a side chain and a structural unit(s) having no side chain is not particularly limited, and there are provided polyimides having an alkyl group or a fluoroalkyl group in a side chain thereof (for example, see "NEW DEVELOPMENT AND HIGH-FUNCTION-IMPARTING TECHNIQUES OF POLYIMIDES INTENDED FOR ELECTRONICS AND ELECTRONIC MATERIALS FOR THE NEXT GENERATION" (published by Technical Information Institute Co., Ltd.)) and the like, wherein polyimides having a multiply-branched structure in a side chain thereof are particularly preferable because it may be possible to change the critical surface tension of the wettability changing layer 12 greatly with a low ultraviolet ray irradiance.

The polyimide having a multiply-branched structure in a side chain thereof may be any of dendrimers and hyper-branchs, wherein a dendrimer is preferable. A dendrimer has a structure branching from the center of a molecule thereof with a good symmetry. On the other hand, a hyperbranch may be obtained by synthesizing an AB2-type monomer and has various degrees of branching and polymerization, that is, has a randomly-branched structure. Additionally, the definitions of a dendrimer and hyperbranch are described in, for example, "DENDRITIC POLYMERS" (published by NTS Inc.).

The side chain having a multiply-branched structure is preferably a structure represented by the general formula (1):

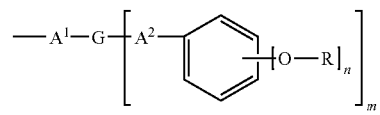

(In the above formula, each of $A^1$ and $A^2$ is independently a single bond or a functional group represented by a structural formula of —COO—, —OCO—, —CONH—, —NHCOO—, or —NHOCO—. m is 1-3 and n is 2 or 3, while G is a phenylene group or a naphthalene group in the case where m is 1, a trivalent benzene ring in the case where m is 2, and a tetravalent benzene ring in the case where m is 3. R is a linear, branched, or cyclic alkyl group or fluoroalkyl group whose carbon number is 1-15 and preferably 6-12, wherein a plural of Rs may be identical to or different from one another. Additionally, if the carbon number of R is 16 or more, the filming performance of the wettability changing layer 12 may be degraded.).

Such a side chain has a hydrophobic group R, but when a light sensitive group such as functional groups represented by structural formulas of —COO—, —OCO—, —CONH—, —NHCOO—, and —NHOCO— is broken by means of ultraviolet ray irradiation, it reacts with water contained in ambient atmosphere so as to create a hydrophilic group such as a carboxylic group or a hydroxyl group.

Furthermore, the polyimide having a multiply-branched structure in a side chain thereof is preferably synthesized from a diamine represented by the general formula (2):

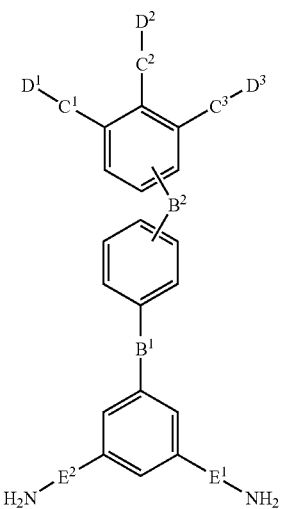

(In the above formula, each of $B^1$ and $B^2$ is independently a single bond or a functional group represented by a structural formula of —O—, —COO—, —CONH—, or —OCO—. Each of $C^1$, $C^2$, and $C^3$ is independently a functional group represented by a structural formula of —O—, —COO—, —CONH—, or —OCO—. Each of $D^1$, $D^2$, and $D^3$ is independently a linear, branched, or cyclic alkyl group whose carbon number is 1-15 and preferably 6-12 and which may be substituted with one or more halogen groups or a functional group represented by the general formula (3):

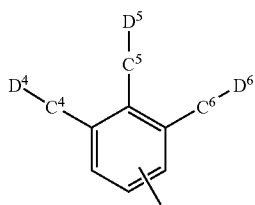

(In the above formula, each of $C^4$, $C^5$, and $C^6$ is independently a functional group represented by a structural formula of —O—, —COO—, —CONH—, or —OCO—, and each of $D^4$, $D^5$, and $D^6$ is independently a linear, branched, or cyclic alkyl group whose carbon number is 1-15 and preferably 6-12 and which may be substituted with one or more halogen groups. Each of $E^1$ and $E^2$ is independently a single bond or a phenylene group.)), a diamine having no side chain, and a tetracarboxylic dianhydride having no side chain via a polyamic acid. Additionally, if the carbon number of R is 16 or more, the filming performance of the wettability changing layer 12 may be degraded.

Such a polyimide having a multiply-branched structure in a side chain thereof has water-repellent groups $D^1$, $D^2$, and $D^3$ (or $D^4$, $D^5$, and $D^6$) but when a light sensitive group such as functional groups represented by structural formulas of —O—, —COO—, —CONH—, or —OCO— is broken by means of ultraviolet ray irradiation, it reacts with water contained in ambient atmosphere so as to create a hydrophilic group such as a carboxylic group or a hydroxyl group.

The tetracarboxylic dianhydride is not particularly limited and there are provided aromatic tetracarboxylic dianhydrides such as pyromellitic dianhydride (PMDA), biphthalic dianhydride (BPDA), oxydiphthalic dianhydride (ODPA), benzophenonetetracarboxylic dianhydride (BTPA), and (hexafluoroisopropylidene)diphthalic dianhydride (6-FDA); and alicyclic dianhydrides such as 5-(2,5-dioxotetrahydrofuryl)-3-methylcyclohenxene-1,2-dicarboxylic dianhydride (DOCDA), bicyclooctene-2,3,5,6-tetracarboxylic dianhydride (BODA), 1,2,3,4-cyclobutanetetracarboxylic dianhydride (CBDA), 1,2,3,4-cyclopentanetetracarboxylic dianhydride (CPDA), and 1,2,4,5-cyclohexanetetracarboxylic dianhydride (CHDA).

The wettability changing layer 12 may be composed of a single material or may be composed of two or more kinds of materials. When the wettability changing layer 12 is composed of a single material, the wettability changing layer 12 is composed of a material whose critical surface tension is changed by providing energy thereto. Furthermore, when the wettability changing layer 12 is composed of two or more kinds of materials, the wettability changing layer 12 preferably contains a material whose critical surface tension is changed by providing energy thereto and an insulating material. Thereby, it may be possible to form a wettability changing layer 12 with a high insulating performance and a large change of the critical surface tension thereof between before and after providing energy thereto. Additionally, when source and drain electrodes are formed as the electrical conductor layers 13, the insulating performance of the wettability changing layer 12 is preferably high in order to reduce gate leak.

The insulating material is not particularly limited and there are provided polyimides, polyamideimides, epoxy resins, silsesquioxanes, polyvinylphenol, polycarbonates, fluororesins, poly(p-xylylene), and the like, wherein polyvinylphenol or polyvinyl alcohol may be crosslinked to use.

When a material with a low filming performance is used for the material whose critical surface tension is changed by providing energy thereto, it may be possible to conduct mixing of a material with excellent compatibility with that material and a high filming performance so as to form the wettability changing layer 12.

Furthermore, when the main chain of the material whose critical surface tension is changed by providing energy thereto is a soluble polyimide, it is preferable that another material composing the wettability changing layer 12 be also soluble. Thereby, it may be possible to form a film of the wettability changing layer 12 at a low temperature. Moreover, another material composing the wettability changing layer 12 is preferably a material with a good compatibility with the soluble polyimide. Thereby, is may be possible to reduce phase separation under the presence of a solvent. Such another material composing the wettability changing layer 12 is not particularly limited and there are provided phenol resins such as polyvinylphenol, melamine resins, polysaccharides such as pullulan subjected to acetylation treatment or the like, silsesquioxanes, and the like, wherein a soluble polyimide is preferable when its heat resistance and compatibility are taken into consideration.

The thickness of the wettability changing layer 12 is preferably 30 nm-3 μm and more preferably 50 nm-1 μm. When the thickness is less than 30 nm, its bulk properties such as its insulating performance, gas barrier property, and moisture barrier property may be deteriorated and when it is greater than 3 μm, the shape of its surface may be deteriorated.

An electronic element according to a specific example of the present invention has a laminated structure according to a specific example of the present invention and FIG. 3 illustrates a first example of an electronic element according to a specific example of the present invention which is a bottom-gate-type organic thin film transistor 20A. Additionally, in FIG. 3, the identical reference numerals are used for the elements identical to those of FIG. 1 and their descriptions are omitted. In the organic thin film transistor 20A, a gate electrode 21 is formed on a substrate 11 and a laminated body composed of an insulator layer 22 and a wettability changing layer 12 is formed on the gate electrode 21. Furthermore, electrical conductor layers (source and drain electrodes) 13 and a semiconductor layer 14 made of an organic semiconductor are formed on the wettability changing layer 12, as similar to the case of FIG. 1.

Figure 4:
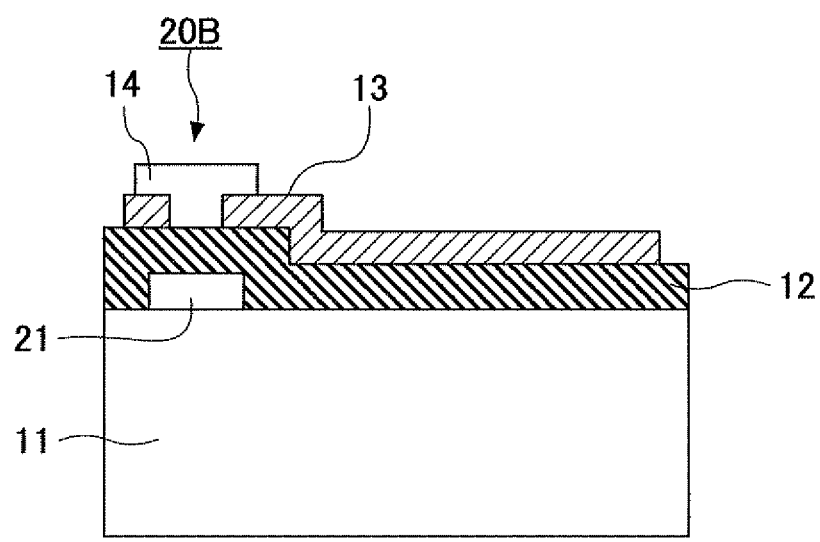
FIG. 4 is a cross-sectional diagram illustrating a second example of an electronic element according to a specific example of the present invention.

FIG. 4 illustrates a second example of an electronic element according to a specific example of the present invention which is an organic thin film transistor 20B. The organic thin film transistor 20B is similar to the organic thin film transistor 20A except that the insulator layer 22 is not formed.

Figure 5:
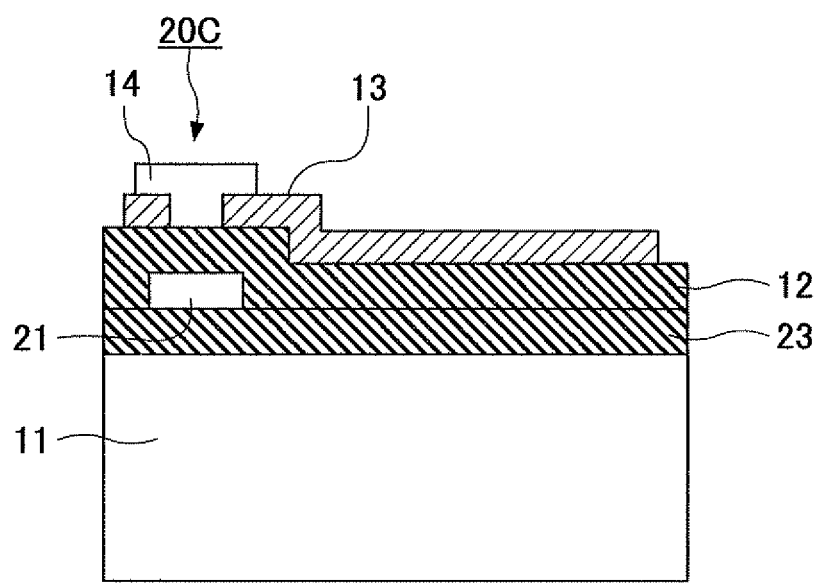
FIG. 5 is a cross-sectional diagram illustrating a third example of an electronic element according to a specific example of the present invention.

FIG. 5 illustrates a third example of an electronic element according to a specific example of the present invention which is an organic thin film transistor 20C. The organic thin film transistor 20C is similar to the organic thin film transistor 20B except that a gate electrode 21 is formed on a wettability changing layer 23. Additionally, the wettability changing layer 23 contains a material whose critical surface tension is changed by providing energy thereto, similarly to a wettability changing layer 12, wherein a material composing the wettability changing layer 23 may be identical to or different from that of the wettability changing layer 12. Herein, a method for forming the gate electrode 21 on the wettability changing layer 23 is similar to the method for forming the electric conductor layers 13 on the wettability changing layer 12. Therefore, the gate electrode 21 is formed on a high surface energy part of the wettability changing layer 23 and the wettability changing layer 12 is formed on, at least, a low surface energy part. Thereby, it may be possible to form a fine pattern of the gate electrode 21 conveniently.

Additionally, the wettability changing layer may also be used for a leading wire as well as source and drain electrodes and a gate electrode.

When the insulating performance of the wettability changing layer 12 is high, the wettability changing layer 12 may also serve as a gate insulating film, similarly to the organic thin film transistors 20B and 20C. Thereby, the insulator layer 22 as in the organic thin film transistor 20A may not be provided. On the other hand, when the insulating performance of the wettability changing layer 12 is low, the wettability changing layer 12 is formed on the insulator layer 22 as a gate insulating film, as in the organic thin film transistor 20A. Herein, a high insulating performance means that a volume resistivity is large.

Additionally, when the wettability changing layer 12 is formed on the insulator layer 22 as in the organic thin film transistor 20A and the wettability changing layer 12 is provided with energy by means of ultraviolet ray irradiation, the absorption coefficient of the wettability changing layer 12 is preferably larger than that of the insulator layer 22. Thereby, it may be possible to reduce the influence of the ultraviolet ray irradiation on the insulator layer 22.

The material composing the insulator layer 22 is not particularly limited and there are provided polyimides, polyamideimides, epoxy resins, silsesquioxanes, polyvinylphenol, polycarbonates, fluororesins, poly(p-xylylene), and the like.

Herein, a method for forming the wettability changing layer 12 or 23 or the insulator layer 22 is not particularly limited, and a printing method, a spin-coat method, a dipping method, and the like are provided.

The electrical conductor layers (source and drain electrodes) 13, the gate electrode 12 and the leading wire are formed through application of a liquid containing an electrically conductive material and its curing by means of heating, ultraviolet ray irradiation, or the like. Additionally, the liquid containing an electrically conductive material is not particularly limited and there are provided a solution in which an electrically conductive material is dissolved in a solvent, a solution in which a precursor of electrically conductive material is dissolved in a solvent, a dispersion liquid in which an electrically conductive material is dispersed in a solvent, a dispersion liquid in which a precursor of electrically conductive material is dispersed in a solvent, and the like. Specifically, there are provided a dispersion liquid in which a particle(s) of a metal such as silver, gold, nickel, or copper is/are dispersed in an organic solvent or water, aqueous solutions of a doped PANI (polyaniline) or an electrically conductive polymer in which PEDOT (polyethylenedioxythiophene) is doped with PSS (polystyrenesulfonic acid), and the like.

Herein, a method for application of the liquid containing an electrically conductive material is not particularly limited and there are provided a spin-coat method, a dip-coat method, a screen printing method, an offset printing method, an ink jet method, and the like, wherein an ink jet method which may provide a comparatively small liquid drop is preferable in order to be more sensitive to the influence of the critical surface tension of a wettability changing layer. When a normal head at a level to be used for a printer is used, the resolution and positioning precision of an ink jet method are 30 µm and about ±15 µm, respectively, wherein it may be possible to form a fine pattern by utilizing the difference of the critical surface tensions of the wettability changing layer.

The material composing the semiconductor layer 14 is not particularly limited and there are provided inorganic semiconductors soluble in a solvent, such as CdSe, CdTe, and Si; and organic semiconductors such as organic low-molecular material soluble in a solvent, such as pentacene, anthracene, tetracene, and phthalocyanine, and precursors thereof; polyphenylene-type electrically conductive polymers such as polyacetylene-type electrically conductive polymers, poly(p-phenylene) and derivatives thereof, and polyphenylenevinylene and derivatives thereof; heterocyclic electrically conductive polymers such as polypyrrole and derivatives thereof, polythiophene and derivatives thereof, and polyfuran and derivatives thereof; and ionic electrically conductive polymers such as polyaniline and derivatives thereof, wherein an organic semiconductor is preferable because it may be possible to simplify a process for manufacturing an electronic element such as an organic thin film transistor and to reduce the cost thereof.

Herein, a method for forming the semiconductor layer 14 is not particularly limited, and a printing method, a spin-coat method, a dipping method, and the like are provided.

The substrate is not particularly limited and there are provided glasses; plastics such as polyesters, polycarbonates, polyallylates, polyethersulfones, polyethylene terephthalate, and polyethylene naphthalate; SUS; and the like, wherein a plastic is preferable in the case where its flexibility is required.

Figure 6A:
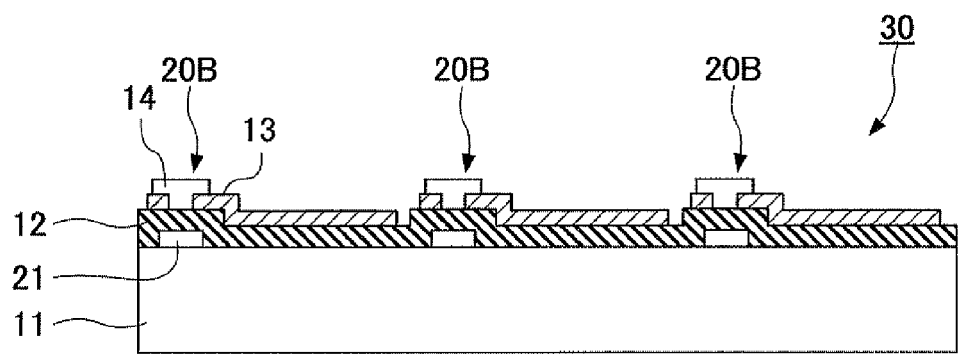
FIG. 6A and FIG. 6B are diagrams illustrating one example of an electronic element array according to a specific example of the present invention.
Figure 6B:
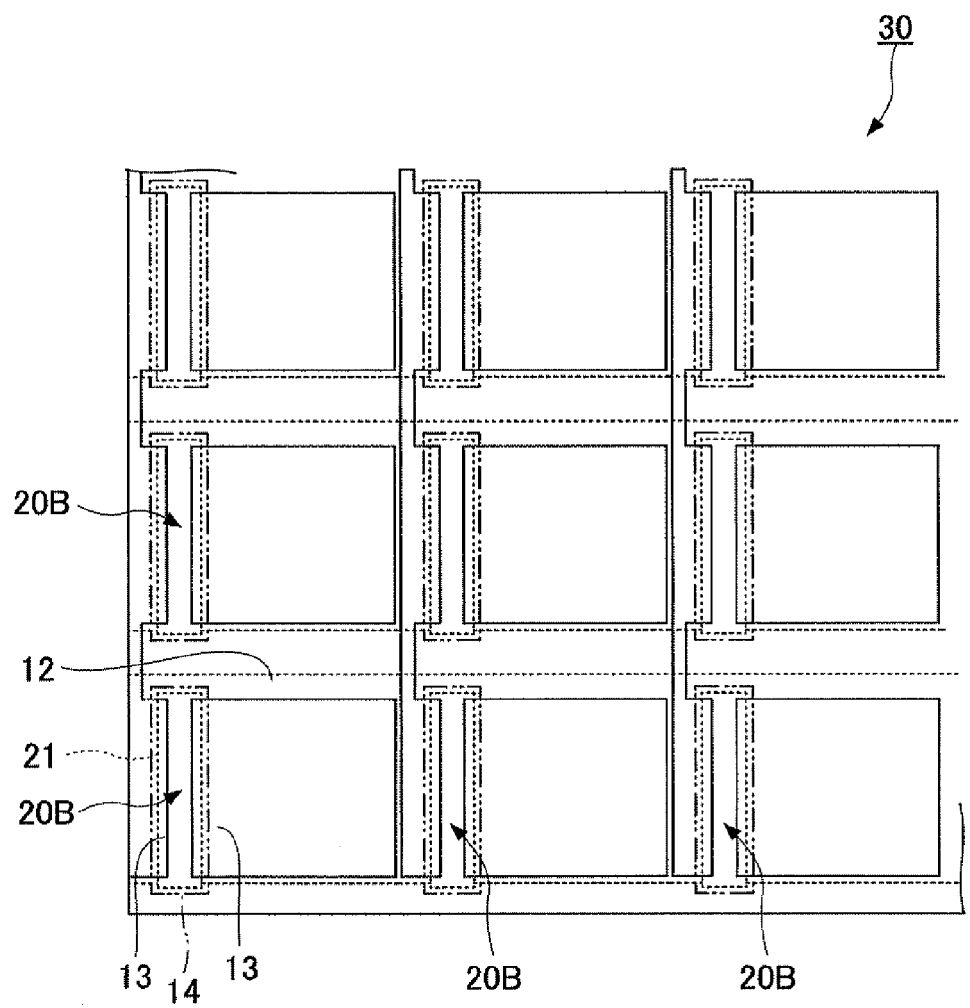

An electronic element array according to a specific example of the present invention has a plurality of electronic elements according to a specific example of the present invention, and FIG. 6A and FIG. 6B illustrate one example of an electronic element array according to a specific example of the present invention which is an organic thin film transistor array 30 having a plurality of the organic thin film transistors 20B. Additionally, FIG. 6A and FIG. 6B are its cross-sectional view and top view, respectively.

Figure 7:
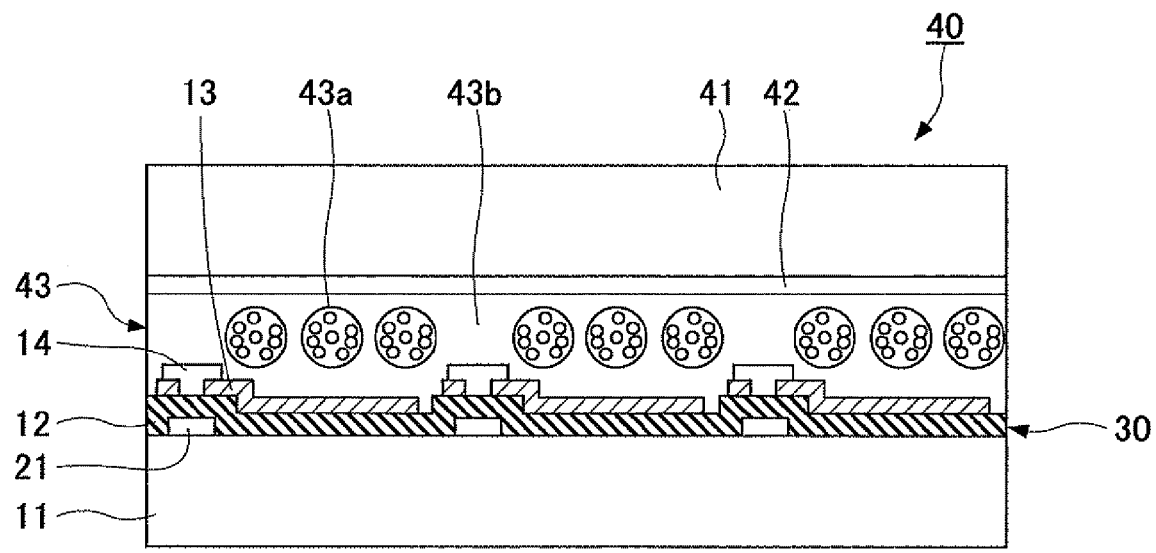
FIG. 7 is a cross-sectional diagram illustrating one example of an image displaying medium according to a specific example of the present invention.

An image displaying medium according to a specific example of the present invention has an electronic element array according to a specific example of the present invention and FIG. 7 illustrates one example of an image displaying medium according to a specific example of the present invention which is an electrophoretic panel 40. In the electrophoretic panel 40, a transparent electrode 42 is formed on a transparent substrate 41 and an image displaying layer 43 composed of microcapsules (electrophoretic elements) 43a enclosing white particles and a solvent colored with a dye and a binder 43b is formed on the electrode 42. Furthermore, the image displaying layer 43 is joined with the organic thin film transistor array (active matrix substrate) 30.

Additionally, the image displaying medium according to a specific example of the present invention is not particularly limited to an electrophoretic panel and may be an image displaying medium such as a liquid crystal panel or organic EL panel in which an active matrix substrate is combined with an image displaying element such as a liquid crystal element or an organic EL element.

Figure 8:
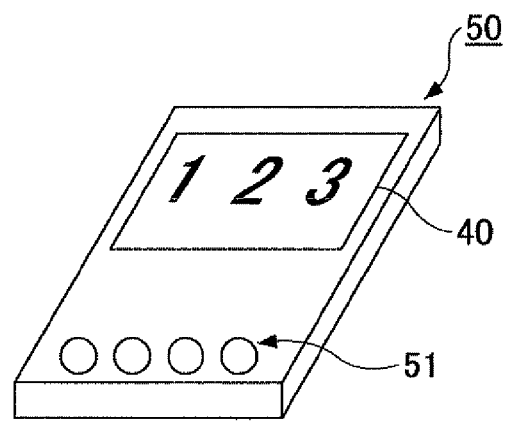
FIG. 8 is a perspective diagram illustrating one example of an image displaying device according to a specific example of the present invention.

An image displaying device according to a specific example of the present invention has an image displaying medium according to a specific example of the present invention and FIG. 8 illustrates one example of an image displaying device according to a specific example of the present invention which is an active matrix displaying device. An active matrix displaying device 50 in which the electrophoretic panel 40 is used for a flat screen may display an image by inputting image information from an input part 51.

The following practical examples are merely intended to explain specific examples of the present invention more specifically and the present invention shall not be limited by any of these practical examples.

[Synthesis of Soluble Polyimide A]

A soluble polyimide A was obtained which is represented by the structural formula (4):

(In the above formula, n is 3, 5, 7, 9, or 11 and x/y is 0/10, 0.5/9.5, 1/9, 2/8, 4/6, 6/4, 8/2, 9/1, 9.5/0.5, or 10/0.) by reacting x mole of a diamine having a side chain, y mole of a diamine having no side chain, and x+y mole of a tetraxarboxylic dianhydride having no side chain in a solvent and subjecting an obtained polyamic acid to chemical imidation treatment. Soluble polyimide A has a dendrimer structure (first generation) in a side chain thereof and further has a spacer containing an ester bond (—COO—) and an amide bond (—NHCO—) between the main chain thereof and the dendrimer structure.

Additionally, although soluble polyimide A was used in the present practical example, the spacer is not limited to a spacer containing one ester bond and one amide bond and may contain two ester bonds or amide bonds. Also, the spacer may be composed of only an ester bond or amide bond.

[Evaluation of a Filming Performance]

After a 5% by weight solution of soluble polyimide A in NMP (N-methyl-2-pyrrolidone) was applied on 10 glass substrates by means of spin-coating and their pre-baking was conducted in an oven at 100° C., the solvent was removed at 180° C. so as to form wettability changing layers. The wettability changing layers formed on the 10 glass substrates were visually observed under a sodium light source thereby evaluating their filming performances. Herein, assessment was made, wherein A indicates that none of defects such as film irregularities, lacks, and cracks was found thereby providing uniform reflected light, B indicates that a defect such as a film irregularity, lack or crack was found partially, and C indicates that a defect such as a filming irregularity, lack or crack was found generally all over. The results of the evaluation are shown in Table 1.

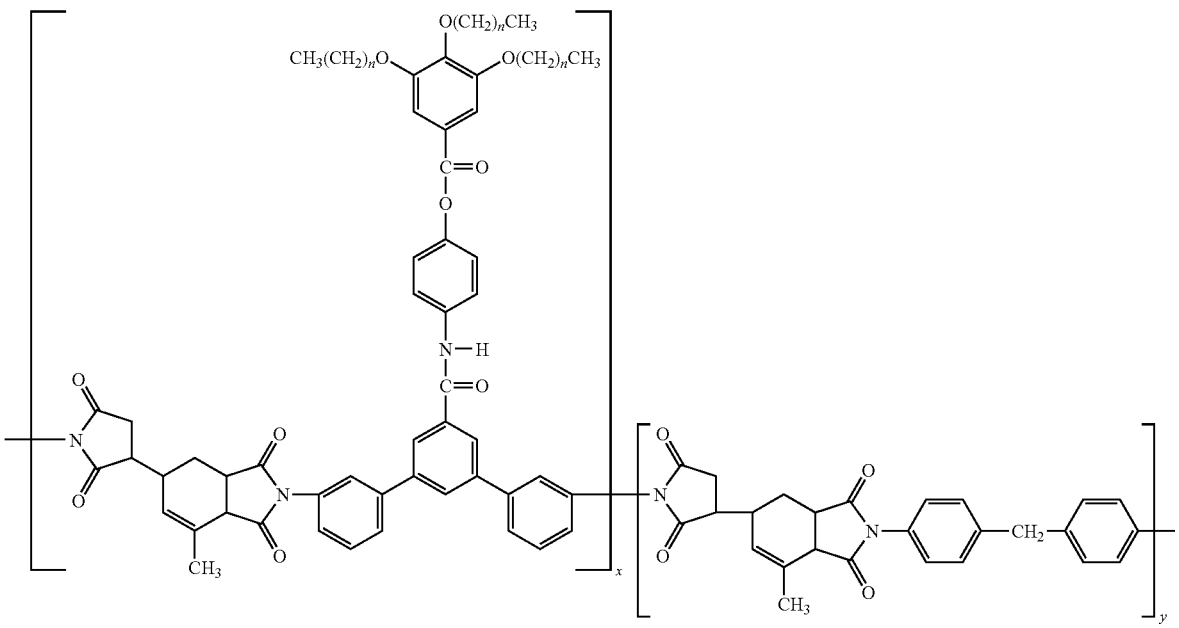

TABLE 1

| | | \multicolumn{10}{c}{x/y} |
|---|---|---|---|---|---|---|---|---|---|---|
| | | 0/10 | 0.5/9.5 | 1/9 | 2/8 | 4/6 | 6/4 | 8/2 | 9/1 | 9.5/0.5 | 10/0 |
| n | 3 | A | A | A | A | A | A | A | B | C | C |
|   | 5 | A | A | A | A | A | A | B | C | C | C |
|   | 7 | A | A | A | A | B | B | C | C | C | C |
|   | 9 | A | A | A | B | C | C | C | C | C | C |
|   | 11 | A | A | B | C | C | C | C | C | C | C |

From Table 1, it is found that it was possible to form a film uniformly on the condition that x/y was about 8/2 or less, in the case of n=3 or n=5. On the other hand, it is found that the film performance was degraded in the case where n was larger or x/y was larger.

[Evaluation of a Contact Angle]

Figure 9:
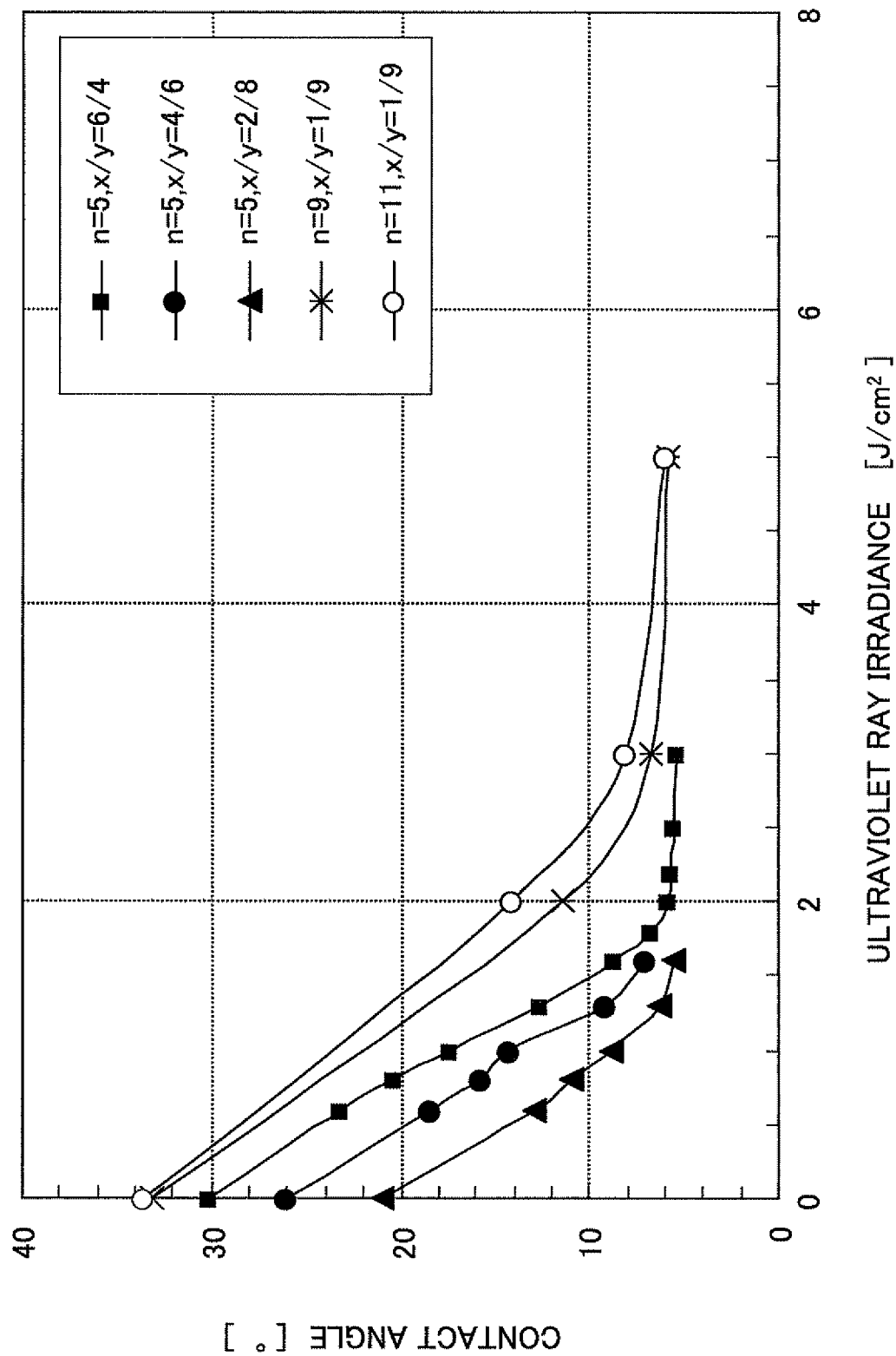
FIG. 9 is a diagram illustrating a change in the contact angel of a silver nano-ink versus ultraviolet ray irradiance.

After the wettability changing layer in which the result of evaluation of the filming performance was good was irradiated with ultraviolet rays with a wavelength of 300 nm or less (from an extra-high pressure mercury lamp) for a predetermined period of time, the contact angles of water and a dispersion liquid (referred to as "silver nano-ink" below) in which silver nano-particles were dispersed in an aqueous solvent were obtained by means of a liquid drop method. Additionally, similar tendencies of the change of the contact angle versus the ultraviolet ray irradiance were found between water and the silver nano-ink. FIG. 9 shows the change of the contact angle of the silver nano-ink versus the ultraviolet ray irradiance.

In FIG. 9, the contact angle at a time when ultraviolet ray irradiation was not conducted (referred to as an initial contact angle, below) in the case of n=5 increased as x/y increased, wherein it was greater than 30° as x/y was 6/4 and its value was comparable to the initial contact angles 33° and 34° at (n=9, x/y=1/9) and (n=11, x/y=1/9). Furthermore, the ultraviolet ray irradiance on which the contact angle was a constant of about 5° (it was impossible to identify a value of 5° or less definitely due to a reason of an apparatus.), in the case of n=5, changed little, even though x/y changed. Moreover, it is found that the ultraviolet ray irradiance on which the contact angle was a constant of about 5°, in the case of n=5, was less than the cases of (n=9, x/y=1/9) and (n=11, x/y=1/9).

As described above, the content of a side chain(s) of soluble polyimide A was increased, whereby it was possible to increase the initial contact angle and it was possible to increase the change of the contact angle between before and after the ultraviolet ray irradiation. Furthermore, even though the initial contact angle increased, the ultraviolet ray irradiance on which the contact angle was a constant of about 5° changed little, and therefore, it was possible to increase the change of the contact angle with a low ultraviolet ray irradiance.

Additionally, the initial contact angle in the case of n=3 also increased as x/y increased, similarly to the case of n=5. However, the initial contact angle was about 23° at x/y of 6/4 and close to 30° at 8/2. Thus, in the case of n=3, it is found that it was necessary to increase x/y in order to increase the change of the contact angle between before and after the ultraviolet ray irradiation.

[Patterning Characteristic Evaluation 1]

After a 5% by weight solution of soluble polyimide A in NMP (N-methyl-2-pyrrolidone) was applied on a glass substrate by means of spin-coating and pre-baking was conducted in an oven at 100° C., the solvent was removed at 180° C. so as to form a wettability changing layer. Then, irradiation was made with ultraviolet rays having a wavelength of 300 nm or less (from an extra-high pressure mercury lamp) through a photo-mask having line shapes spaced 5 μm apart so that the irradiance was 1-10 J/cm², whereby high surface energy parts were formed on the wettability changing layer. Furthermore, after ultrasonic cleaning was made in an aqueous solution of a neutral detergent and water washing was also made with ultrapure water, drying was made in an oven at 120° C. Then, after the silver nano-ink was ejected onto the high surface energy parts by using an ink jet method and its baking was made in oven at 200° C. so as to form an electrode pattern, its patterning characteristic was evaluated by using a metallographical microscope. Additionally, assessment was made wherein A indicates that 100% of the electrode pattern was formed, B indicates that about 95% of it was formed, C indicates that a part of it was not formed, and D indicates that it was little formed. The results of the evaluation are shown in Table 2.

TABLE 2

| | \multicolumn{5}{c}{ULTRAVIOLET RAY IRRADIANCE [J/cm²]} |
|---|---|---|---|---|---|
| | 1 | 2 | 3 | 5 | 10 |
| n = 5, x/y = 6/4 | D | A | A | A | A |
| n = 5, x/y = 4/6 | D | B | B | B | B |
| n = 5, x/y = 2/8 | D | C | C | C | C |
| n = 9, x/y = 1/9 | D | C | B | A | A |
| n = 11, x/y = 1/9 | D | D | B | A | A |

From Table 2, it is found that not-100% of the electrode pattern was formed in the case of n=5 and x/y=2/8 or 4/6 even though the ultraviolet ray irradiance was increased and the contact angle was decreased, because the initial contact angle was not sufficiently large (see FIG. 9.). Furthermore, it is found that 100% of the electrode pattern was formed by using the ultraviolet ray irradiance on which the contact angle was a constant of about 5°, in the case of n=5 and x/y=6/4, or n=9 and x/y=1/9, or n=11 and x/y=1/9, because the initial contact angle was sufficiently large.

[Patterning Characteristic Evaluation 2]

After a 5% by weight solution of soluble polyimide A in NMP (N-methyl-2-pyrrolidone) was applied on a glass substrate by means of spin-coating and pre-baking was conducted in an oven at 100° C., the solvent was removed at 180° C. so as to form a wettability changing layer. Then, irradiation was made with ultraviolet rays having a wavelength of 300 nm or less (from an extra-high pressure mercury lamp) through a photo-mask having line shapes spaced 5 μm apart so that the irradiance was 5 J/cm², whereby high surface energy parts were formed on the wettability changing layer. Furthermore, after ultrasonic cleaning was made in an aqueous solution of a neutral detergent and water washing was also made with ultrapure water, drying was made in an oven at 120° C. Then, after the silver nano-ink was ejected onto the high surface energy parts by using an ink jet method and its baking was conducted in oven at 200° C. so as to form an electrode pattern, its patterning characteristic was evaluated by using a metallographical microscope. Additionally, assessment was made wherein A indicates that 100% of the electrode pattern was formed, B indicates that about 95% of it was formed, C indicates that a part of it was not formed, and D indicates that it was little formed. The results of the evaluation are shown in Table 3.

TABLE 3

| | | | | | | x/y | | | | | |
|---|---|---|---|---|---|---|---|---|---|---|---|
| | | 0/10 | 0.5/9.5 | 1/9 | 2/8 | 4/6 | 6/4 | 8/2 | 9/1 | 9.5/0.5 | 10/0 |
| n | 3 | D | D | D | D | D | D | C | B | — | — |
| | 5 | D | D | D | C | B | A | A | — | — | — |
| | 7 | D | D | C | B | A | A | — | — | — | — |
| | 9 | D | B | A | A | — | — | — | — | — | — |
| | 11 | D | B | A | — | — | — | — | — | — | — |

Additionally, the wettability changing layer whose filming performance is indicated by D in table 1 was not evaluated. In Table 3, it was possible to form an electrode pattern in the case of n=3 as x/y was increased but it was difficult to form 100% of it. The patterning characteristic was improved by increasing x/y in the case of n=5 or n=7, and it was possible to form 100% of the electrode pattern in the case of n=5 and x/y=6/4 or 8/2 or n=7 and x/y=4/6 or 6/4. Furthermore, it was possible to form 100% of the electrode pattern in the case of n=9 and x/y=1/9 or 2/8 or n=11 and x/y=1/9.

In combination with the results of evaluation of the filming performance, it is found that a combination allowed to provide a filming performance that is good and a fine electrode pattern that is formed by an ink jet method is found in n=3-11 and preferably in n=5-9.

[Transistor Characteristic Evaluation 1]

A gate electrode 21 having a thickness of 50 nm and made of aluminum was formed on a glass substrate 11 by a vacuum deposition method using a metal mask. Then, an insulator layer 22 having a thickness of 400 nm and made of parylene was formed thereon by a chemical vapor deposition method. Then, after soluble polyimide A (n=5 and x/y=6/4) or a 5% by weight solution of soluble polyimide A (n=5 and x/y=2/8) in NMP (N-methyl-2-pyrrolidone) was applied thereon by means of spin-coating and its pre-baking was conducted in an oven at 100° C., the solvent was removed at 180° C. so as to form a wettability changing layer 12 with a thickness of 100 nm. Then, irradiation was made with ultraviolet rays having a wavelength of 300 nm or less (from an extra-high pressure mercury lamp) through a photo-mask having line shapes spaced 5 μm apart so that the irradiance was 5 J/cm$^2$, whereby high surface energy parts were formed on the wettability changing layer 12. Then, after the silver nano-ink was ejected onto the high surface energy parts by using an ink jet method and its baking was conducted at 200° C. so as to form electrical conductor layers (source and drain electrodes) 13 with a thickness of 60 nm. Then, a coating liquid in which an organic semiconductor material A represented by the structural formula (5):

was dissolved in a mixed solvent of xylene/mesitylene was dropped onto a channel region between the source and drain electrodes by using an ink jet method and its drying was conducted at 120° C. so that a semiconductor layer 14 with a film thickness of 40 nm was formed, thereby manufacturing an organic thin film transistor 20A (see FIG. 3.). Herein, the insulator layer 22 and the wettability changing layer 12 acted as gate insulating films. The transistor characteristic of each of 10 organic thin film transistors 20A was evaluated. The average value of the results of their evaluation is shown in Table 4.

TABLE 4

| | n = 5, x/y = 6/4 | n = 5, x/y = 2/8 |
|---|---|---|
| ON-OFF RATIO | 5 DIGITS | 3 DIGITS |
| FIELD-EFFECT MOBILITY [cm$^2$/V·sec] | $5 \times 10^{-3}$ | $4 \times 10^{-4}$ |

From Table 4, it is found that the field effect mobility in the case of x/y=6/4 was $5\times10^{-3}$ cm$^2$/V·s while the field effect mobility of the organic thin film transistor manufactured by using source and drain electrodes made of gold and manufactured by means of vacuum deposition through a metal mask was $6\times10^{-3}$ cm$^2$/V·s and therefore comparable to the one described above. On the other hand, the field effect mobility in the case of x/y=2/8 was in the order of $10^{-4}$ cm$^2$/V·s and the on-off ratio was in the 3 digits. It is considered that this is because the change of the contact angle of the wettability changing layer 12 between before and after ultraviolet ray irradiation was not sufficient.

Therefore, it is found that it may be possible to manufacture an organic thin film transistor in which its filming performance is good and its transistor characteristic is good, by changing x/y appropriately in order to increase the change of the contact angle of a wettability changing layer between before and after ultraviolet ray irradiation.

[Transistor Characteristic Evaluation 2]

A gate electrode 21 having a thickness of 50 nm and made of aluminum was formed on a glass substrate 11 by a vacuum deposition method using a metal mask. Soluble polyimide A (n=5 and x/y=6/4) or a 5% by weight solution of soluble polyimide A (n=5 and x/y=2/8) in NMP was mixed with a 10% by weight solution of a polyimide CT4112 (produced by KYOCERA Chemical Corporation) having no side chain and an insulating performance higher than that of the polyimide in NMP such that the weight ratio thereof was 5:95, thereby preparing a coating liquid.

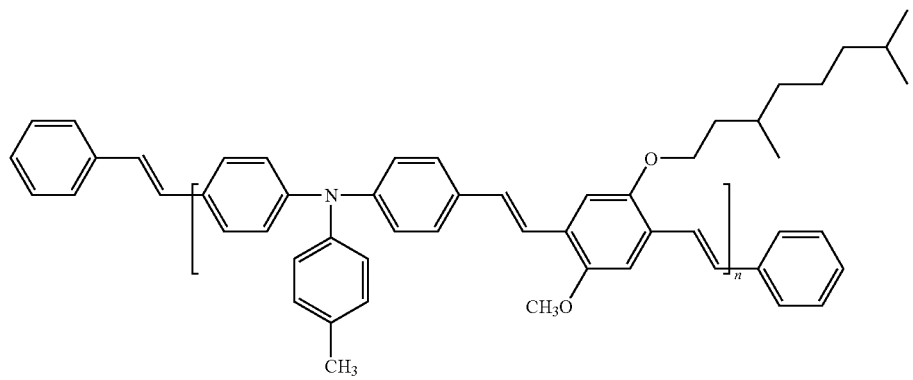

Then, after the coating liquid was applied, by means of spin-coating, on a glass substrate 11 on which a gate electrode 21 had been formed, and its pre-baking was conducted on a hot plate at 80° C., the solvent was removed at 180° C. so as to form a wettability changing layer 12 with a thickness of 600 nm. Then, irradiation was made with ultraviolet rays having a wavelength of 300 nm or less (from an extra-high pressure mercury lamp) through a photo-mask having line shapes spaced 5 μm apart so that the irradiance was 6 J/cm², whereby high surface energy parts were formed on the wettability changing layer 12. Then, after the silver nano-ink was ejected onto the high surface energy parts by using an ink jet method and its baking was conducted at 200° C. so as to form electrical conductor layers (source and drain electrodes) 13 with a thickness of 60 nm. Then, a coating liquid in which organic semiconductor material A was dissolved in toluene was dropped onto a channel region between the source and drain electrodes by using a dispenser capable of micro-quantitative application and its drying was conducted at 120° C. so that a semiconductor layer 14 with a film thickness of 40 nm was formed, thereby manufacturing an organic thin film transistor 20B (see FIG. 4.). Herein, the wettability changing layer 12 acted as a gate insulating film. The transistor characteristic of each of 10 organic thin film transistors 20B was evaluated. The average value of the results of their evaluation is shown in Table 5.

TABLE 5

|  | n = 5, x/y = 6/4 | n = 5, x/y = 2/8 |
|---|---|---|
| ON-OFF RATIO | 5 DIGITS | 3 DIGITS |
| FIELD-EFFECT MOBILITY [cm²/V · sec] | $3 \times 10^{-3}$ | $1 \times 10^{-4}$ |

From Table 5, it is found that the field effect mobility in the case of x/y=6/4 was $3 \times 10^{-3}$ cm²/V·s and comparable to that of the organic thin film transistor manufactured by using source and drain electrodes made of gold and manufactured by means of vacuum deposition through a metal mask. On the other hand, the field effect mobility in the case of x/y=2/8 was in the order of $10^{-4}$ m²/V·s and the on-off ratio was in the 3 digits. It is considered that this is because the change of the contact angle of the wettability changing layer 12 between before and after ultraviolet ray irradiation was not sufficient.

Therefore, it is found that it may be possible to manufacture an organic thin film transistor in which the filming performance of a wettability changing layer is good and its transistor characteristic is good, by changing x/y appropriately in order to increase the change of the contact angle of the wettability changing layer between before and after ultraviolet ray irradiation.

Additionally, because the hydrophobicity of soluble polyimide A is higher than that of the polyimide CT4112 (produced by KYOCERA Chemical Corporation) having no side chain, it is considered that phase separation was caused in a process in which the solvent vaporized after the application by means of spin-coating whereby soluble polyimide A was present on the surface preferentially. Therefore, it is considered that it may be possible to form a pattern of source and drain electrodes by irradiating the wettability changing layer 12 with ultraviolet rays.

Furthermore, when an organic thin film transistor was manufactured similarly to that described above except that a gate insulating film made of the polyimide CT4112 (produced by KYOCERA Chemical Corporation) having no side chain was formed instead of the wettability changing layer 12, no transistor characteristic was exhibited. This is because the ultraviolet ray irradiance was not sufficient so that no channel region was formed between the source and drain electrodes.

[Synthesis of Soluble Polyimide B]

Similarly to soluble polyimide A, a soluble polyimide B represented by the structural formula (6):

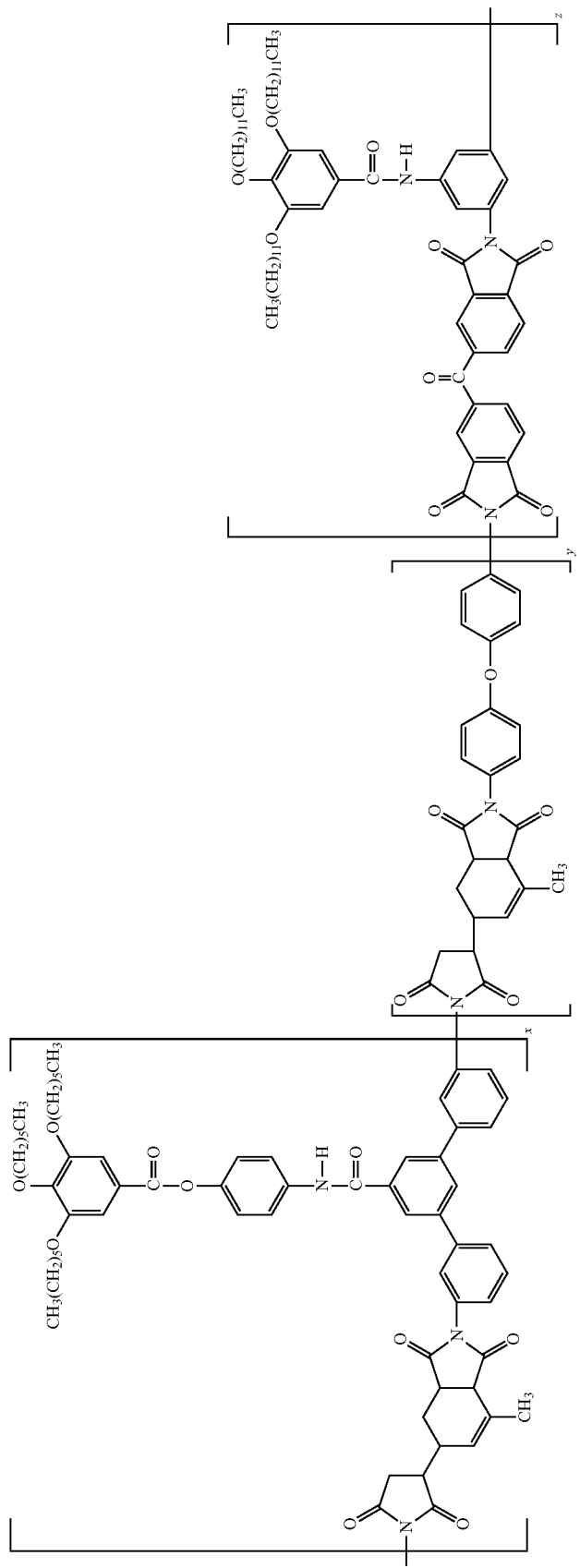

(In the above formula, x:y:z is 2:7:1, 2:8:0, or 0:9:1.) was obtained.

[Evaluation of a Filming Performance]

After a 5% by weight solution of soluble polyimide B in NMP (N-methyl-2-pyrrolidone) was applied on 10 glass substrates by means of spin-coating and their pre-baking was conducted in an oven at 100° C., the solvent was removed at 180° C. so as to form wettability changing layers. The wettability changing layers formed on the 10 glass substrates were visually observed 10 times under a sodium light source thereby evaluating their filming performances. The results of the evaluation are shown in Table 6.

TABLE 6

| x:y:z | | |
|---|---|---|
| 2:7:1 | 2:8:0 | 0:9:1 |
| A | A | C |

Herein, their criteria are the same as the case of Table 1. From Table 6, it is found that it was possible to form a film uniformly in the case of x:y:z=2:7:1 or x:y:z=2:8:0. On the other hand, in the case of x:y:z=0:9:1, particulates were precipitated and no good film was obtained. It is considered that this is because the carbon number of an alkyl group of a side chain was large and accordingly the cohesive force was large.

[Evaluation of a Contact Angle]

After the wettability changing layer in which the result of evaluation of the filming performance was good was irradiated with ultraviolet rays with a wavelength of 300 nm or less (from an extra-high pressure mercury lamp) for a predetermined period of time, the contact angles of water and the silver nano-ink were obtained by means of a liquid drop method. Additionally, similar tendencies of the change of the contact angle versus the ultraviolet ray irradiance were found between water and the silver nano-ink. Table 7 shows the results of evaluation of the change of the contact angle of the silver nano-ink versus the ultraviolet ray irradiance.

TABLE 7

| | x:y:z | |
|---|---|---|
| | 2:7:1 | 2:8:0 |
| INITIAL CONTACT ANGLE [°] | 30 | 22 |
| CONTACT ANGLE AFTER IRRADIATION WITH ULTRAVIOLET RAYS AT 5 J/cm$^2$ [°] | 4.6 | 4.7 |

From Table 7, it is found that the initial contact angle in the case of x:y:z=2:7:1 was large than that of the case of x:y:z=2:8:0. Furthermore, the contact angle after ultraviolet ray irradiation at 5 J/cm$^2$ was reduced to about the measurement limit in any case.

As described above, it was possible to increase the change of the contact angle between before and after ultraviolet ray irradiation by introducing a structural unit in which the carbon number of an alkyl group of a side chain was large into soluble polyimide whose initial contact angle is small as in the case of x:y:z=2:8:0. Furthermore, even though the initial contact angle increased, the contact able after ultraviolet ray irradiance at 5 J/cm$^2$ little changed, and therefore, it was possible to increase the change of the contact angle with a low ultraviolet ray irradiance.

[Transistor Characteristic Evaluation 3]

A gate electrode 21 with a thickness of 50 nm was formed by etching a gold film formed on the whole surface of a glass substrate 11 according to photolithography.

Soluble polyimide B (x:y:z=2:7:1) or a 5% by weight solution of soluble polyimide B (x:y:z=2:8:0) in NMP was mixed with a 10% by weight solution of a polyimide CT4112 (produced by KYOCERA Chemical Corporation) having no side chain and an insulating performance higher than that of the polyimide in NMP such that the weight ratio thereof was 5:95, thereby preparing a coating liquid.

Then, after the coating liquid was applied, by means of spin-coating, on a glass substrate 11 on which a gate electrode 21 had been formed, and its pre-baking was conducted in an oven at 100° C., the solvent was removed at 180° C. so as to form a wettability changing layer 12 with a thickness of 600 nm. Then, irradiation was made with ultraviolet rays having a wavelength of 300 nm or less (from an extra-high pressure mercury lamp) through a photo-mask having line shapes spaced 5 μm apart so that the irradiance was 7 J/cm$^2$, whereby high surface energy parts were formed on the wettability changing layer 12. Then, the silver nano-ink was ejected onto the high surface energy parts by using an ink jet method and its baking was conducted at 160° C. so as to form electrical conductor layers (source and drain electrodes) 13 with a thickness of 40 nm. Then, a coating liquid in which organic semiconductor material A was dissolved in a mixed solvent of xylene/mesitylene was dropped onto a channel region between the source and drain electrodes by using an ink jet method and its drying was conducted at 120° C. so that a semiconductor layer 14 with a film thickness of 40 nm was formed and an organic thin film transistor 20B was manufactured (see FIG. 4.). Herein, the wettability changing layer 12 acted as a gate insulating film. The transistor characteristic of each of 10 organic thin film transistors 20B was evaluated. The average value of the results of their evaluation is shown in Table 8.

TABLE 8

| | x:y:z | |
|---|---|---|
| | 2:7:1 | 2:8:0 |
| ON-OFF RATIO | 5 DIGITS | 3 DIGITS |
| FIELD-EFFECT MOBILITY [cm$^2$/V · sec] | $1 \times 10^{-3}$ | $2 \times 10^{-4}$ |

From Table 8, it is found that the field effect mobility in the case of x:y:z=2:7:1 was $1 \times 10^{-3}$ m$^2$/V·s and comparable to that of the organic thin film transistor manufactured by using source and drain electrodes made of gold and manufactured by means of vacuum deposition through a metal mask. On the other hand, the field effect mobility in the case of x:y:z=2:8:0 was in the order of $10^{-5}$ m$^2$/V·s and the on-off ratio was in the 2 digits. It is considered that this is because the change of the contact angle of the wettability changing layer 12 between before and after ultraviolet ray irradiation was not sufficient.

Therefore, it is found that it may be possible to manufacture an organic thin film transistor in which the filming performance of a wettability changing layer is good and its transistor characteristic is good, by means of introduction of a structural unit in which the carbon number of an alkyl group of a side chain is large, in order to increase the change of the contact angle of the wettability changing layer between before and after ultraviolet ray irradiation.

Additionally, because the hydrophobicity of soluble polyimide B is higher than that of the polyimide CT4112 (produced by KYOCERA Chemical Corporation) having no side chain, it is considered that phase separation was caused in a process in which the solvent vaporized after the application by means of spin-coating whereby soluble polyimide B was present on the surface preferentially. Therefore, it is considered that it may be possible to form a pattern of source and drain electrodes by irradiating the wettability changing layer 12 with ultraviolet rays.

Furthermore, when an organic thin film transistor was manufactured similarly to that described above except that a gate insulating film made of the polyimide CT4112 (produced by KYOCERA Chemical Corporation) having no side chain was formed instead of the wettability changing layer 12, no transistor characteristic was exhibited. It is considered that this is because the ultraviolet ray irradiance was not sufficient so that no channel region was formed between the source and drain electrodes.

[Manufacturing of an Electrophoretic Panel]

An organic thin film transistor array 30 (see FIG. 6A and FIG. 6B.) having 200×200 organic thin film transistors 20B (the pitch between elements was 127 μm) in the manner of 2-dimensional array was manufactured by using soluble polyimide B (x:y:z=2:7:1) similarly to the organic thin film transistor 20B.

The average value of the field effect mobilities of the plural organic thin film transistors 20B was $1.1 \times 10^{-3}$ cm$^2$/V·s.

Then, an electrophoretic panel 40 (see FIG. 7.) was manufactured by using the organic thin film transistor array 30. Specifically, a coating liquid in which microcapsules 43a containing titanium oxide particles and Isoper colored with oil blue therein and an aqueous solution of polyvinyl alcohol (PVA) were mixed was applied on a transparent ITO electrode 42 provided on a transparent polycarbonate substrate 41 so as to form an image displaying layer 43 composed of the microcapsules 43a and a PVA binder 43b. Then, the image displaying layer 43 and the organic thin film transistor array 30 were bonded such that substrates 11 and 41 provided its outermost surfaces. Then, when a driver IC for a scanning signal and a driver IC for a data signal are connected to a bus line communicating with the gate electrode 21 and a bus line communicating with the source electrode, respectively, and switching of images was conducted every 0.5 seconds, it was possible to display a good static image.

Although the illustrative embodiments and specific examples of the present invention have been described above with reference to the accompanying drawings, the present invention is not limited to any of the illustrative embodiments and specific examples and the illustrative embodiments and specific examples may be altered or modified without departing from the scope of the present invention.

INDUSTRIAL APPLICABILITY

An illustrative embodiment or specific example of the present invention may be applicable to at least one of a laminated structure and a method of manufacturing the same.

The present application claims the benefit of the priority based on Japanese Patent application No. 2008-027912 filed on Feb. 7, 2008 in Japan, the entire contents of which are hereby incorporated by reference herein.

The invention claimed is:

1. A laminated structure, comprising;
a substrate;
a wettability changing layer on the substrate, the wettability changing layer comprising a material, wherein a critical surface tension of the material is capable of being changed by providing energy thereto; and
an electrically conductor layer on the substrate, the electrically conductor layer formed on a region of the wettability changing layer, the region being provided with the energy,
wherein the material consists of a structural unit comprising a side chain and a structural unit comprising no side chain,
wherein the side chain comprises a multiply-branched structure, represented by the general formula (1):

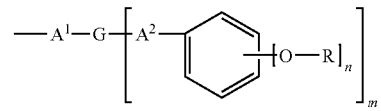

wherein, each of $A^1$ and $A^2$ is independently a single bond or a functional group represented by a structural formula of —COO—, —OCO—, —CONH—, —NHCOO—, or —NHOCO—, m is 1-3 and n is 2 or 3, while G is a phenylene group or a naphthalene group in the case m is 1, a trivalent benzene ring in the case where m is 2, and a tetravalent benzene ring in the case where m is 3, R is a linear, branched, or cyclic alkyl group or fluoroalkyl group whose carbon number is 1-15, wherein a plural of Rs may be identical to or different from one another.

2. The laminated structure as claimed in claim 1, wherein the material comprises 5 mole % or more and 80 mole % or less of the structural unit comprising a side chain.

3. The laminated structure as claimed in claim 1, wherein a main chain of the material is a polyimide.

4. The laminated structure as claimed in claim 1, wherein the laminated structure further comprises a semiconductor layer.

5. An electronic element, comprising the laminated structure as claimed in claim 1.

6. An electronic element array, comprising a plurality of the electronic elements as claimed in claim 5.

7. An image displaying medium, comprising the electronic element array as claimed in claim 6.

8. An image displaying device, comprising the image displaying medium as claimed in claim 7.

* * * * *